(12) United States Patent  
Bolle et al.

(10) Patent No.: US 8,828,520 B2
(45) Date of Patent: Sep. 9, 2014

(54) MICRO-POSTS HAVING IMPROVED UNIFORMITY AND A METHOD OF MANUFACTURE THEREOF

(75) Inventors: Cristian A. Bolle, Bridgewater, NJ (US); Flavio Pardo, New Providence, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 12/165,880

(22) Filed: Jul. 1, 2008

(65) Prior Publication Data

US 2010/0003460 A1 Jan. 7, 2010

(51) Int. Cl.
*B32B 3/00* (2006.01)
*B81C 1/00* (2006.01)

(52) U.S. Cl.
CPC ..... *B81C 1/00039* (2013.01); *B81B 2203/0361* (2013.01); *B81B 2203/0118* (2013.01); *B81B 2207/056* (2013.01); *B81B 2201/047* (2013.01); *B81B 2203/0384* (2013.01); *B61B 2203/0307* (2013.01)
USPC ........................................................ 428/156

(58) Field of Classification Search
USPC .................. 428/156, 157, 172, 166, 141, 167
See application file for complete search history.

(56) References Cited

U.S. PATENT DOCUMENTS

| 6,339,462 | B1 | 1/2002 | Kishimoto et al. | |
| 6,489,857 | B2 | 12/2002 | Petrarca et al. | |
| 6,605,339 | B1 * | 8/2003 | Marshall et al. | 428/195.1 |
| 7,518,697 | B2 | 4/2009 | Yamada et al. | |
| 2002/0088769 | A1 * | 7/2002 | Antaki et al. | 216/59 |
| 2004/0185188 | A1 * | 9/2004 | Amano et al. | 428/1.51 |
| 2005/0270472 | A1 | 12/2005 | Yamada et al. | |
| 2009/0162798 | A1 * | 6/2009 | Tomono | 430/320 |

FOREIGN PATENT DOCUMENTS

| CN | 1704808 A | 12/2005 | |
| JP | 2000081623 A | 3/2000 | |
| JP | 2003107444 A | 4/2003 | |
| JP | 2006018238 A | 1/2006 | |
| KR | 1020020042422 A | 6/2002 | |
| WO | WO 2008020631 A1 * | 2/2008 | ................ G03F 7/20 |

OTHER PUBLICATIONS

Kitson, S. and Geisow, A.; "Controllable alignment of nematic liquid crystals and microscopic posts"; Stabilization of multiple states, Applied Physics Letters, May 2002, vol. 80, pp. 3635-3637.

Yang, M.T. et al.; "Geometric Considerations of Micro-to Nanoscale Elastomeric Post Arrays to Study Cellular Traction Forces"; Advanced Materials, 2007, vol. 19, pp. 3119-3123.

Baldi, A. et al.; A Micro-tool for mechanical Manipulation of in vitro Cell Arrays, Biomedical Microdevices, Dec. 2003, vol. 5, pp. 291-295.

(Continued)

*Primary Examiner* — Catherine A Simone
(74) *Attorney, Agent, or Firm* — Hitt Gaines, PC

(57) ABSTRACT

As discussed herein, there is presented an apparatus comprising micro-posts. The apparatus includes a substrate having a planar surface, a plurality of micro-posts located on the planar surface, wherein each micro-post has a base portion on the planar surface and a post portion located on a top surface of the corresponding base portion, and wherein side surfaces of the base portions intersect the planar surface at oblique angles.

12 Claims, 4 Drawing Sheets

(56) References Cited

OTHER PUBLICATIONS

Li. B.; "Development of Micropost Force Sensor Array with Culture experiments for Determination of Cell Traction Forces"; Cell Motility and the Cytoskeleton, 2007, vol. 64, pp. 509-518.

Written Opinion and Search Report for Related PCT case PCT/US2009/003874 dated Jan. 26, 2010; 12 pages.

Search Report, First Office Action of China Application No. 200980125032.1, Applicant Alcatel-Lucent USA Inc., 6 pages And translation 7 pages.

* cited by examiner

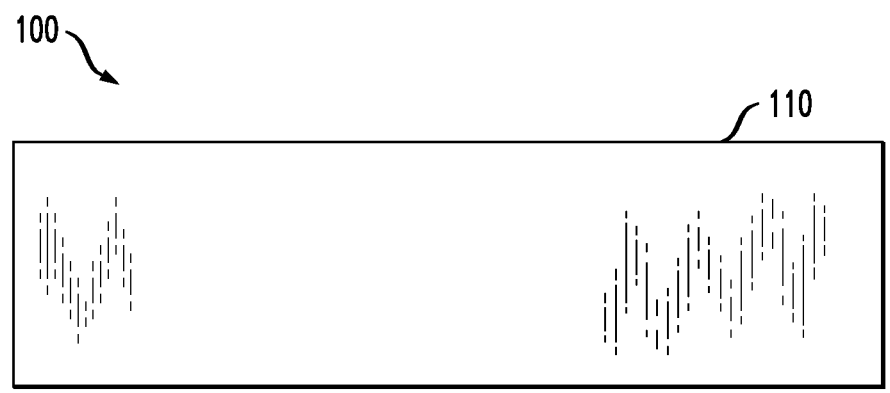
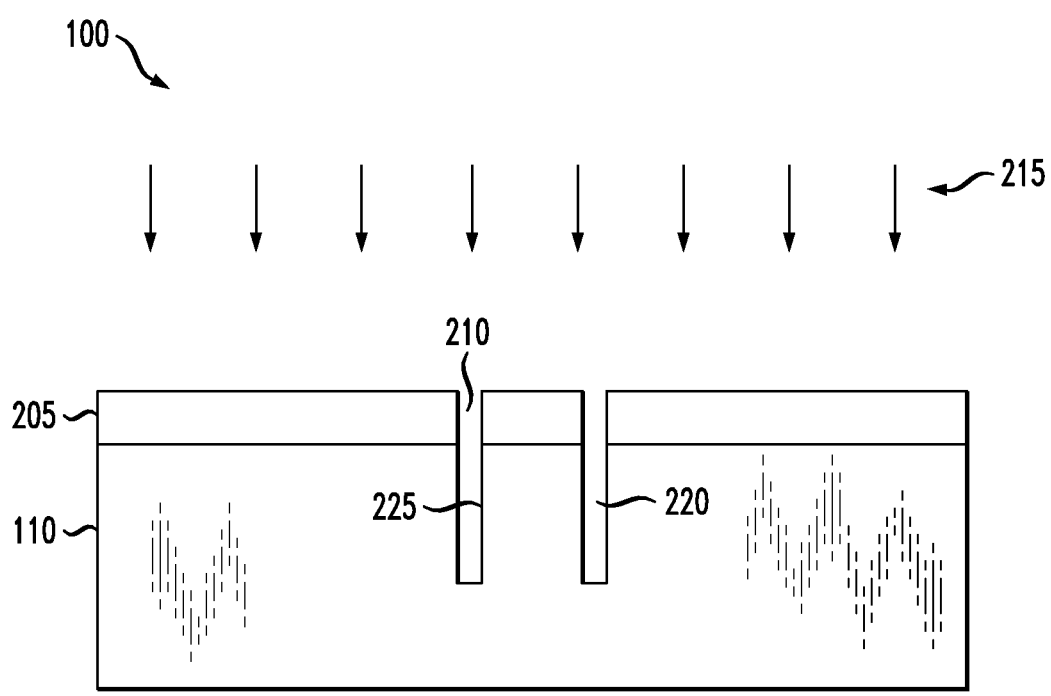

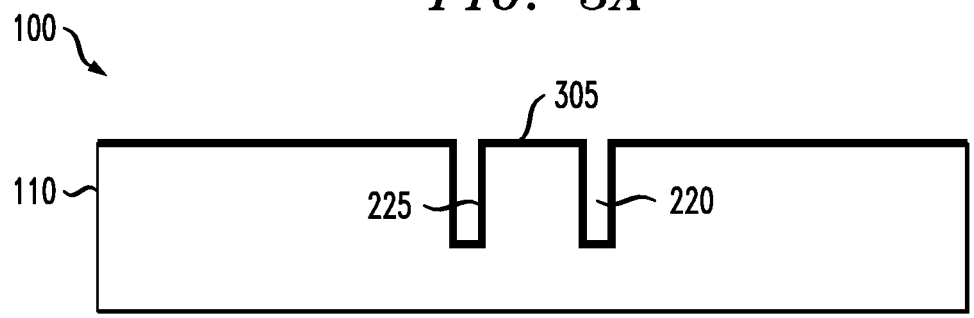
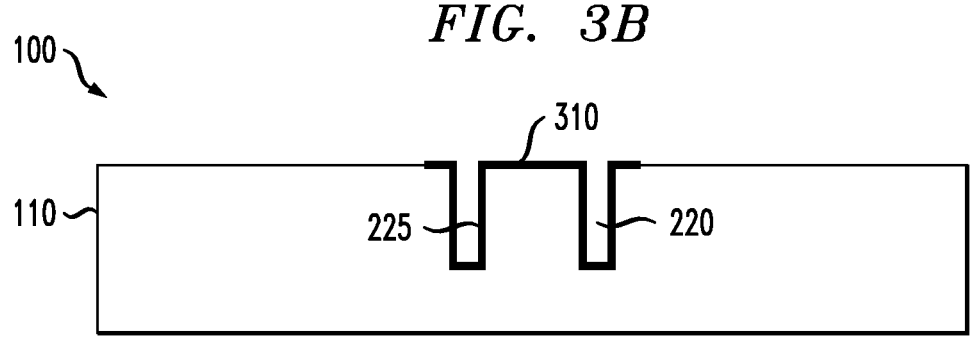
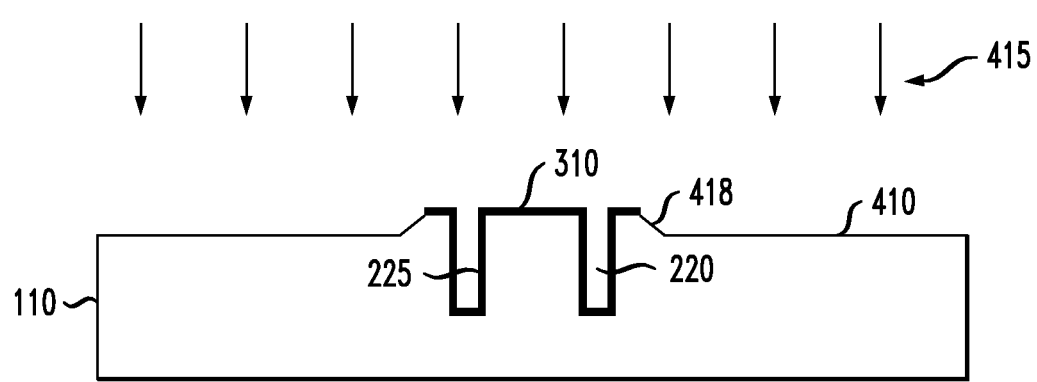

US 8,828,520 B2

MICRO-POSTS HAVING IMPROVED UNIFORMITY AND A METHOD OF MANUFACTURE THEREOF

TECHNICAL FIELD

The present invention is directed, in general, to an apparatus and methods for fabricating that apparatus method and, more specifically, to micro-posts and a method of fabricating those micro-posts.

BACKGROUND

Micromachines, which are also referred to as micro electro mechanical system (MEMS) is an emerging technology that uses the tools and techniques, which were developed for the integrated circuit industry, to build microscopic machines. These machines, which are generally considered to be between 100 nanometers to 100 micrometers in size, are typically built on standard silicon wafers. The advantage of this technology is that many machines can be built at the same time across the surface of the wafer, and the processes used to fabricate these devices employ the same type of lithographic processes used to fabricate integrated circuits. These tiny machines are becoming ubiquitous and quickly finding their way into a variety of commercial and defense applications.

As with any type of manufacturing effort, particularly as the sizes at which these devices are made, overall product quality, uniformity, and yield are important industry goals.

SUMMARY

One embodiment as presented herein is directed to an apparatus. In this embodiment, the apparatus comprises a substrate having a planar surface, a plurality of micro-posts located on the planar surface, wherein each micro-post has a base portion on the planar surface and a post portion located on a top surface of the corresponding base portion, and wherein side surfaces of the base portions intersect the planar surface at oblique angles.

Another embodiment is directed to a method for fabricating the apparatus. This embodiment comprises performing a dry etch to form a post portion of a micro-post in a trench on a surface of a substrate, performing a wet etch to remove a layer from said substrate such that the post portion is located on a base portion and the base portion is located on a planar surface of the substrate, wherein the base portion has side surfaces that intercept the top planar surface obliquely.

BRIEF DESCRIPTION OF THE DRAWINGS

The various embodiments can be understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which:

FIG. 1 illustrates an apparatus of the disclosure at an early stage of manufacture;

FIG. 2 illustrates the apparatus of FIG. 1 after the formation of a trench in the substrate that defines a post;

FIGS. 3A-3B illustrate the formation and patterning of an etch mask following the formation of the trench;

FIGS. 4A-4D illustrate various stages of an etch process that can be used to form the micropost, which includes a base portion.

DETAILED DESCRIPTION

Figure 4B:
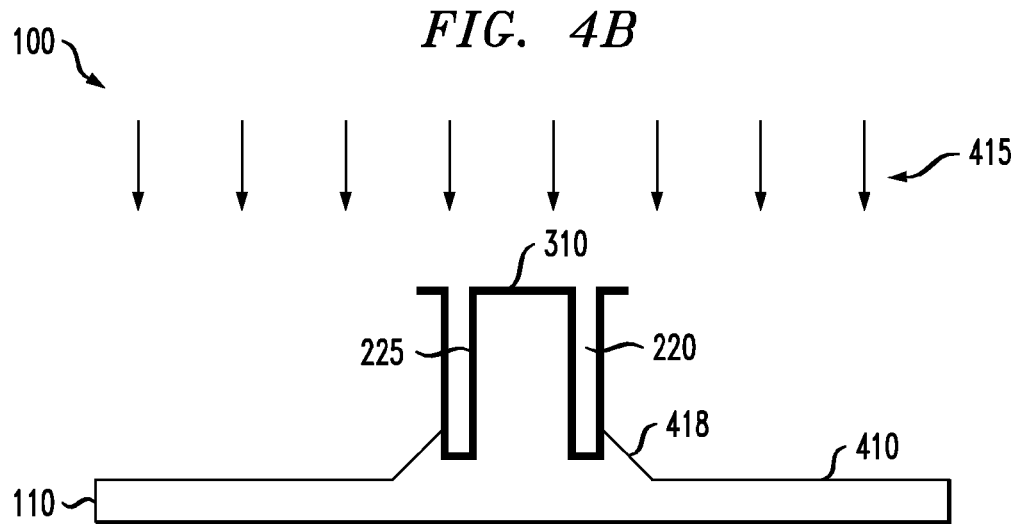

The embodiments discussed herein recognize the benefits associated with micro-posts having substantially uniform height across a substantially planar substrate, such as a semiconductor wafer. The side surfaces of the base portion intersect the surface at oblique angles and have a reduced lateral profile. As used herein a micro-post is a post with a height of less than about 100 micrometers and may have a number of geometric shapes, such as a rectangle, a polygon, or a cylinder. These micro-posts are an improvement over previous structures in that the uniform height across the substrate provides overall improved device yield and quality. Further, the reduced base width provides improved component density. Moreover, in other applications, such as those directed to infrared detectors, the height of the micro-posts can be controlled to provide flexibility in tuning, that is, to allow appropriate sizing of cavities to achieve the desired wavelengths for the infrared detector. Method embodiments, which are also discussed herein, provide methods for achieving the improved apparatus.

FIG. 1 shows an example apparatus 100 of the present disclosure at an early stage of manufacture. This embodiment includes a substrate 110, which may be obtained from an internal or external source. Non-limiting examples of the substrate 110 may include semiconductor substrates comprising materials, such as silicon, silicon-germanium, gallium arsenide, indium phosphide, or combinations of these materials. In some embodiments, the substrate 110 may further include a material layer (not shown) that overlies the substrate 110 from which the micro-posts may be formed. In such embodiments, an etch stop layer may be present. The material, when present, may comprise the same materials listed above for the substrate 110, or it may comprise a different material. In one advantageous embodiment, the substrate 110 is silicon. As discussed below, in those embodiments where the substrate 110 or material layer is silicon, the presenting face (i.e., the crystal plane an etch initially encounters) may have a <100> crystal orientation, a <110> crystal orientation, or a <111> crystal orientation. Conventional processes may be used to form the substrate 110.

The thickness of the substrate 110 will depend on the intended application. For example, in those applications where the apparatus 100 may be a tilting mirror of a MEMS device, the thickness of the substrate 110 may be at least 20 microns or greater. Alternatively, in those applications where the apparatus 100 may be an infrared detector, the substrate 110 may have a thickness of 2 microns or greater. These values are given for illustrative purposes only, and it should be understood that other thickness may also be used and will depend on the intended application of the apparatus.

Given the advantages of improved height uniformity and higher component densification as provided herein, thicker substrates can be used while avoiding the problems associated with conventional apparatus and fabrication processes. In conventional processes, manufacturers used either a dry etch to form stand-alone posts with no base portion from the substrate, or they used a wet etch to form truncated support structures, both had associated problems. If the dry etch was used in conventional processes, significant post height non-uniformity across the wafer often occurred. Dry etched posts have the height non-uniformity issues typically associated with dry etching with variations in height of 10% to 15% across a wafer being normal. In addition, if isolated posts are desired, the amount of material that has to be removed between the posts may account for 99% of the wafer surface, and chemical loading of the etch chemistry may completely change the etching nature.

On the other hand, even though an anisotropic wet etch can be highly uniform with below 1% variations in post height being the norm, the wet etch results in a truncated pyramidal-shaped structure, rather than a post, that can consume an unacceptably large amount of surface area on the substrate wafer. Thus, conventional processes left the manufacture with basically one of two options; either use a dry etch process to form stand-alone posts from the material layer while tolerating a significant amount of height non-uniformity across the substrate, or us a wet etch to form truncated bases that consumed an unacceptably large amount of surface area. The embodiments of the present disclosure address both of these problems.

Embodiments of the processes, and thus, the resulting apparatus, described herein provide a benefit of being able to use a thicker substrate 110 that produces micro-posts with improved height uniformity and greater component densification when compared to conventional processes. For example, the height of the resulting micro-posts may be within 5% of each other and preferably, the height may be within 1% or better, across the substrate 110 when commercially available wet etching tools are used. This provides an advantage of improved overall yield and apparatus quality.

Additionally, the embodiments covered by this disclosure also provide a micro-post having a much smaller base, which allows for greater component densification. For instance, in certain embodiments as disclosed herein, the ratio of the micro-post height to base width may be 2:1 or greater, with other embodiments including micro-posts having a height to base width ratio of 5:2 or greater.

FIG. 2 illustrates the apparatus 100 following the deposition and patterning of a lithographic mask 205. The lithographic mask 205 may comprise a conventional material, such as an organic photoresist or a hardmask material, such as silicon oxide. The lithographic mask 205 may be patterned to define openings 210 through which an etch 215 may be conducted. In one advantageous embodiment, the etch 215 is a dry etch, such as a conventional plasma etch, a sputter etch, ion milling etch, a reactive ion etch, deep reactive ion etch, or focused ion beam milling process, that can readily be conducted for the desired amount of time. The etch time will depend on the etching process being used, the material being etched, and the targeted depth of the etch 215 into the substrate 110 and could readily be determined by those of skill in the art. In those instances where the etch 215 uses a plasma process, the etching chemistry and plasma conditions will depend on the tool, the composition of the substrate 110 and the target depth.

For example, in one embodiment, the substrate 110 may comprise silicon. In such instances, the plasma etch may include any known chloro or fluorocarbon gas, such as $CCl_4$, $CF_4$, $C_4F_8$, or a sulfur-fluoro gas, such as $SF_6$. As defined by the mask 205, the etch 215 forms a trench 220 in the substrate 110, which, in turn, defines a post 225. The depth of the trench will vary depending on the application. For instance, the depth of the trench 220 may range from about 2 microns to about 100 microns or greater. It should be noted that although FIG. 2 shows a cross section of a fabricated post, the shape of the post top surface can be fairly arbitrary and is not restricted to circular cylindrical shape, e.g., the post may have a cross-section that is a regular polygon.

FIG. 3A illustrates the apparatus 100 of FIG. 2 following the formation of the trench 220 and the micro-post 225 and the removal of the lithographic mask 205. Thereafter, an etch mask layer 305 is formed on the substrate 110, on the walls of the trench 220 and on the top of the post 225, as generally illustrated. The etch mask layer 305 may be formed a number of ways. For example, the etch mask layer 305 may be formed by subjecting the substrate 110 to a wet oxidation process to grow a thin (e.g., about 0.1 microns) silicon oxide layer, e.g., a conformal layer. Alternatively, conventional deposition processes may be used to deposit the etch mask layer 305, which may be comprised of a material, such as silicon nitride.

FIG. 3B illustrates the apparatus 100 of FIG. 3A after a conventional patterning of the etch mask layer 305 to form an etch mask 310. The etch mask 310 protects the covered surfaces from a subsequent etch process. In certain embodiments, the etch mask 310 may be patterned to leave an overhanging portion of the etch mask 310 on the surface of the substrate 110, as shown. For instance, the amount of overhang may range from about 0.25 microns to about 3.0 microns, depending on the type of lithography tool used. However, in other embodiments, the etch mask 310 may be patterned such that no overhang is present and the mask 310 terminates as the edge of the trench 220.

FIG. 4A illustrates the apparatus 100 of FIG. 3B wherein a presenting face 410 of the substrate 110 is subjected to a wet etch 415. In one advantageous embodiment, the substrate 110 is silicon, and the wet etch 415 is an anisotropic etch comprising either potassium hydroxide (KOH) or tetra methyl ammonium hydroxide (TMAH). Either of these chemistries may be used to etch various presenting crystalline faces of silicon or silicon germanium. As such, the weight percent of these etching components with water and the temperature at which the etch is conducted will vary. In one example, the silicon may have a presenting face 410 with a crystal orientation of <100>. In such cases, the wet etch 415 is conducted with KOH wherein the KOH comprises from about 20% to about 45% by weight of an aqueous solution, and the etch may be conducted at a temperature that ranges from about 30° C. to about 80° C.

In another embodiment, the silicon may have a presenting face 410 with a crystal orientation of <110>. In such embodiments, the wet etch 415 may be conducted with KOH where the KOH comprises from about 30% to about 45% by weight of an aqueous solution, and the etch may be conducted at a temperature that ranges from about 20° C. to about 120° C. In yet other embodiments, the wet etch 415 may comprise tetra methyl ammonium hydroxide (TMAH), wherein TMAH comprises from about 20% to about 25% by weight of the aqueous solution and the etch is conducted at a temperature ranging from about 60° C. to about 90° C.

As mentioned above, the substrate 110 may be one of a number of semiconductor materials, e.g., crystalline semiconductor materials, and may comprise other semiconductor materials such as, silicon-germanium, gallium arsenide, indium phosphide, etc. In such instances and given the disclosure as set forth herein, those who are skilled in the art would understand how to select the appropriate etch chemistry that would produce an anisotropic etch. For example, if the substrate 110 is a crystalline gallium arsenide substrate, the etch chemistry may comprise bromide in methanol or an aqueous solution of ammonium hydroxide.

Due to the crystalline structure of the substrate 110, the etch 415 etches the presenting face 410 more quickly that the lateral face. Thus, the etch 415 begins to undercut the etch mask 310 and form an angled face 418, as seen in FIG. 4A. The etch mask 310 is resistant to the etch 415, and thus, protects the surfaces of the post 225. FIG. 4B shows the continued progression of the etch 415 and the further undercutting of the etch mask 310 and removal of the substrate 110 from the substrate 115.

Figure 4C:
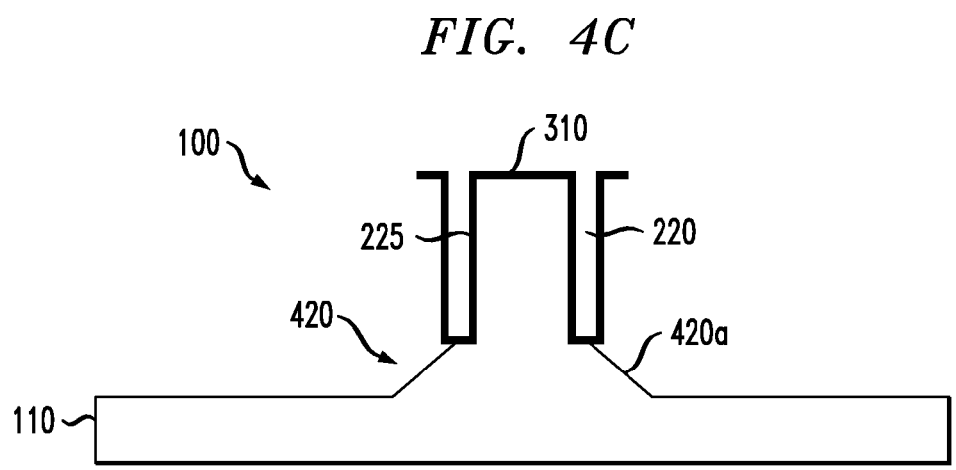

At the conclusion of the etch 415, base 420 is formed, as shown in FIG. 4C. As seen, in this embodiment, the side surfaces 420a of the base portion 420 intersect the planar surface 110a at oblique angles. At this point in the process, the etch mask 310 may then be removed using a conventional etch process, such as an aqueous hydrofluoric etch.

Figure 4D:
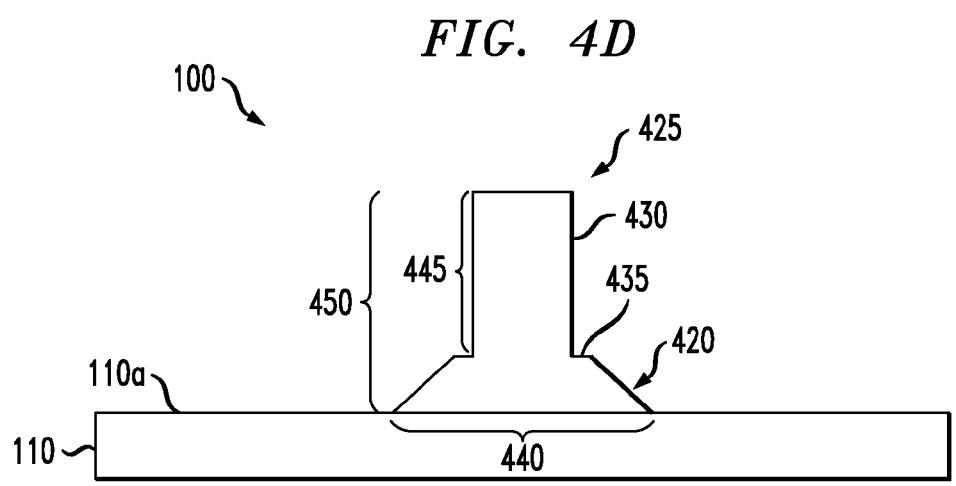

FIG. 4D illustrates an embodiment of the apparatus 100 of FIG. 4C following the removal of the etch mask 310. In this embodiment, the apparatus 100 includes a micro-post 425 that includes a vertical wall 430. Though one micro-post 425 is shown, it should be understood that the embodiments discussed herein may be used to form a plurality of such micro-posts on the substrate 110. In one application, for example, there may be 20 or more micro-posts 425. The micro-post 425 is located on the planar surface 110a of the substrate 110. It should be noted that a surface may be planar even though minor surface irregularities or surface roughness may be present at the sub-micron scale, but over all the surface 110a is substantially planar. The micro-post 425 includes the base portion 420 formed by the etch 415, as discussed above, and a post portion 430 located on a top surface 435 of the base portion 420.

In one aspect where a plurality of micro-posts 425 are present, the lateral width of each of the base portions 420 is at least 2 times as large as the diameter of each of the post portions 430. In yet another embodiment, the top surface 435 of one of the base portions 420 has an area that is less than half of the area of the planar surface 110a covered by the base portions 420. In other embodiments, a ratio of a height of each post portion 430 to the width 440 of each base portion 420 is at least about 2:1. It should be noted that the micro-post 425 may be considered to have a post portion even though the diameter along the length of the micro-post 425 may vary due to process variations. For example, in one embodiment, the post portion 430 may have a diameter that varies by less than 30% along the length of the post portion 430.

In another embodiment, the apparatus 100 includes a plurality of at least 20 adjacent micro-posts 425, and the heights 445 of the different micro-posts 420 differ by less than 5 percent over the plurality, and in yet another embodiment, the heights 445 of the different micro-posts 420 differ by less that 1 percent over the plurality.

Figure 5A:
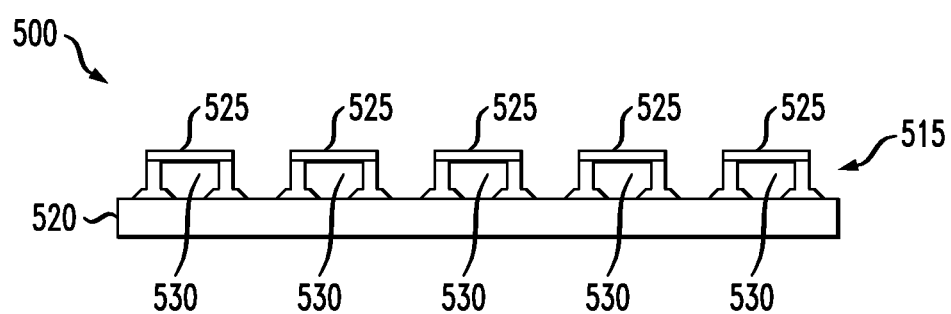
FIGS. 5A-5B illustrate examples of different devices into which the apparatus may be configured.
Figure 5B:
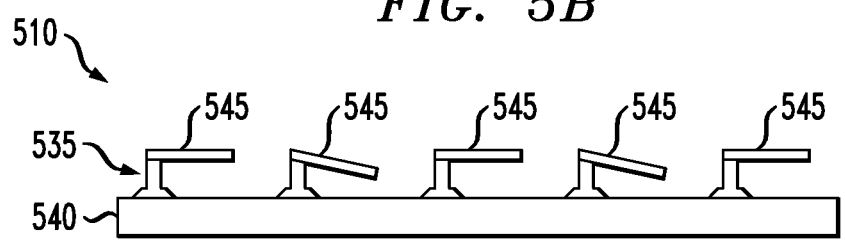

FIGS. 5A and 5B illustrate different apparatus 500 and 510 in which the micro-post of FIG. 4D may be used. Apparatus 500 of FIG. 5A illustrates a general schematic view of a configuration of an infrared detector. As seen in this embodiment, the apparatus 500 includes a plurality of micro-posts 515 located across a substrate 520, such as a wafer. The micro-posts 515 support different membranes 525 that form cavities 530. In view of the advantages discussed above, the micro-posts 515 have uniform height and a reduced base footprint that allows for overall improved product yield, product quality, and component densification.

Apparatus 510 of FIG. 5B illustrates a general schematic view of a configuration of a MEMS device. As seen in this embodiment, the apparatus 510 includes a plurality of micro-posts 535 located across a substrate 540, such as a wafer. The micro-posts 535 support different titling mirrors 545. In view of the advantages discussed above, the micro-posts 535 can be manufactured to have improved height with an improvement in height uniformity and a reduced base footprint that allows for overall improved device operability, product yield, product quality, and component densification.

Although the present invention has been described in detail, those skilled in the art should understand that they can make various changes, substitutions and alterations herein without departing from the spirit and scope of the invention.

What is claimed is:

1. An apparatus, comprising:
   a substrate having a planar surface;
   a plurality of micro-posts, of crystalline semiconductor material located on the planar surface, each micro-post being formed of a base portion on the planar surface and a single post portion located on the base portion, each post portion extending from a top flat surface of the corresponding base portion; and
   wherein side surfaces of the base portions intersect the planar surface at oblique angles.

2. The apparatus of claim 1, wherein on the planar surface, lateral widths of the base portions are at least 2 times as large as diameters of the single post portions.

3. The apparatus of claim 1, wherein the top flat surface of one of the base portions has an area that is less than half of the area of the planar surface covered by the one of the base portions.

4. The apparatus of claim 1, wherein each single post portion has a diameter that varies by less than 30 percent along the length of the single post portion.

5. The apparatus of claim 1, wherein the plurality includes at least 20 adjacent micro-posts, and the heights of different ones of the micro-posts differ by less than 5 percent over the plurality.

6. The apparatus of claim 1, wherein the plurality includes at least 20 adjacent micro-posts, and the heights of different ones of the micro-posts differ by less than 1 percent over the plurality.

7. The apparatus of claim 1, wherein the micro-posts comprise a material that makes up a portion of the substrate.

8. An apparatus, comprising:
   a substrate having a planar surface;
   a plurality of micro-posts, of crystalline semiconductor material located on the planar surface, each micro-post being formed of a base portion on the planar surface and a single post portion extending from the corresponding base portion, each post portion having one or more sidewalls, the one or more sidewalls being vertical to the planar surface; and
   wherein side surfaces of the base portions intersect the planar surface at oblique angles.

9. The apparatus of claim 1, wherein on the planar surface, lateral widths of the base portions are at least 2 times as large as diameters of the single post portions.

10. The apparatus of claim 8, wherein the plurality includes at least 20 adjacent micro-posts, and the heights of different ones of the micro-posts differ by less than 5 percent over the plurality.

11. The apparatus of claim 8, wherein the plurality includes at least 20 adjacent micro-posts, and the heights of different ones of the micro-posts differ by less than 1 percent over the plurality.

12. The apparatus of claim 8, wherein the single post portion extends substantially vertically from the top flat surface of the corresponding base portion.

* * * * *